United States Patent [19]
Levy et al.

[11] Patent Number: 5,825,208
[45] Date of Patent: Oct. 20, 1998

[54] METHOD AND APPARATUS FOR FAST EVALUATION OF DYNAMIC CMOS LOGIC CIRCUITS

[75] Inventors: Howard Lawrence Levy; Salim Ahmed Shah, both of Austin, Tex.

[73] Assignee: International Business Machines Corporation, Armonk, N.Y.

[21] Appl. No.: 650,691

[22] Filed: May 20, 1996

[51] Int. Cl.[6] .......................... H03K 19/01; H03K 19/00
[52] U.S. Cl. ................... 326/98; 326/17; 326/97
[58] Field of Search .................. 326/93–98, 17, 326/121, 27–28; 257/330–331

[56] References Cited

U.S. PATENT DOCUMENTS

| | | | |
|---|---|---|---|
| T926,003 | 9/1974 | Nomiya et al. | 326/96 |
| 4,554,570 | 11/1985 | Jastrzebski et al. | 257/331 |
| 5,263,173 | 11/1993 | Gleason | 326/121 |
| 5,324,673 | 6/1994 | Fitch et al. | 257/330 |

FOREIGN PATENT DOCUMENTS 3-263919  11/1991  Japan ..................... 326/97

*Primary Examiner*—Jon Santamauro
*Attorney, Agent, or Firm*—Liddell, Sapp, Zivley, Hill & LaBoon,L.L.P.; Anthony V. S. England

[57] ABSTRACT

According to the present invention, a domino CMOS logic circuit having a plurality of stages for evaluating logic signals is provided. In one embodiment, the domino CMOS logic circuit includes at least one stage which has a logic block that includes a plurality of logic devices, inputs and outputs, and a precharge/evaluate circuit. In a more specific embodiment, the circuit includes a first transistor having a source connected to a supply voltage, a gate connected to a delayed clock signal, and a drain, a second transistor having a source connected to the drain of the first transistor, a gate connected to a clock signal, and a drain connected to the outputs of the logic block.

17 Claims, 8 Drawing Sheets

METHOD AND APPARATUS FOR FAST EVALUATION OF DYNAMIC CMOS LOGIC CIRCUITS

FIELD OF THE INVENTION

The present invention generally relates to the field of logic circuits. More particularly, this invention relates to a method and apparatus for allowing fast evaluation of dynamic CMOS logic circuits.

BACKGROUND OF THE INVENTION

There are basically two categories of integrated CMOS logic circuits currently in use. One category, known as static CMOS logic, typically requires no external clock for controlling its operation, and the logic gates which comprise the static CMOS logic circuit can preserve their states as long as power is supplied to the circuit. The other category is referred to as dynamic CMOS logic. A dynamic CMOS logic circuit normally requires an external clock signal for proper operation. Dynamic CMOS logic gates are desirable for many integrated circuit applications, such as high performance microprocessors, because dynamic CMOS logic gates typically allow faster operation, can consume lower power, and require less silicon area for fabrication than static CMOS logic gates.

FIG. 1 is a schematic diagram of a conventional dynamic CMOS circuit. The circuit of FIG. 1 comprises a logic block 106 located between precharge transistor 102 and evaluation, or discharge, transistor 104. Precharge transistor 102 is a P-type field effect transistor ("PFET") having a source connected to a supply voltage, such as Vdd, and a drain connected to the output of logic block 106. Evaluation transistor 104 is an N-type field effect transistor ("NFET") having a source coupled to logic block 106 and its drain connected to ground.

In this case, logic block 106 is a simple NAND gate comprising a pair of series connected N-type field effect transistors. Of course, it is to be understood that the above example is for purposes of illustration only, and logic block 106 can comprise much more complex logic circuits than those shown here. Inputs A and B are provided to the gates of transistors 106a and 106b, respectively, while the output of logic block 106 is provided at Z. Clock signal CLK is provided to the gates of precharge transistor 102 and evaluation transistor 104.

Clock signal CLK is typically a two phase clock. One phase occurs when the voltage level for clock signal CLK is low. This is known as the precharge phase. The other phase, when CLK is high, is known as the evaluation phase. As seen in the figure, when clock signal CLK is in the precharge phase, transistor 102 is turned on while evaluation transistor 104 is turned off. Therefore, logic block 106 is isolated from ground and node Z is charged to Vdd. During the evaluation phase, transistor 102 is turned off and evaluation transistor 104 is turned on. This allows the charge stored on node Z to conditionally discharge to ground through evaluation transistor 104. This discharge is said to be "conditional" because it depends on the status of inputs A and B. For example, in this illustration, inputs A and B must both be high during the evaluation phase to pull output signal Z low. Otherwise, output Z remains high.

In implementing more complex logic circuits, it is often desirable to cascade several logic blocks together. This is often referred to as "domino" logic. Conventional domino circuits are described in U. S. Pat. Nos. 5,399,921, 5,440,243, 5,440,250, 5,285,406, 5,208,489, 5,121,003, 5,150,309, 5,015,882, 4,896,057, 4,710,650, all of which are incorporated herein by reference.

FIG. 2 is a schematic diagram of a conventional "domino" logic circuit having three stages 202, 204 and 206. Each stage comprises a plurality of logic blocks which each have at least one input and an output. Each logic block is provided with a precharge transistor which pulls the output high during the precharge phase, and an evaluation transistor which provides for conditional discharge of the output as discussed previously. For example, stage 202 comprises output blocks 210a–210n. Logic block 210a has inputs 214aa–214an and output 216a. Precharge and evaluation of logic block 210a is provided by transistors 208a and 212a respectively. Output 216a is buffered by inverter 218a before being provided to logic block 224a of stage 2. Similarly, logic block 21 On receives inputs 214na–214nn and provides an output 216n which is buffered by inverter 218n and passed to logic block 224a. Similar circuitry connects logic blocks 224a–224n to logic blocks 236a–236n. Precharge and evaluation of logic block 210n is performed by transistors 208n and 212n respectively. Of course, it will be appreciated that the circuitry within each logic block, as well as the interconnection between the input and outputs of the logic blocks is wholly a matter of design choice and the interconnection shown in FIG. 2 are just one particular illustration.

During the precharge phase of clock signal 240, the outputs of each logic block 210a–21On, 224a–224n and 236a–236n are pulled high (sometimes referred to as logic level 1) by precharge transistors 208a–208n, 222a–222n and 234a–234n respectively. Since these outputs are connected to corresponding inputs of the subsequent logic stage by inverters, it is ensured that the precharge phase sets the inputs of each logic block in the domino circuit low (sometimes referred to as logic level 0). Typically, the transistors comprising the logic blocks are N-type devices. Therefore, when clock 240 initially transitions to the evaluation phase, all logic devices in the logic blocks will be off, and there will be no discharge path for any of the outputs, unless the inputs are from static circuits.

However, for purposes of illustration, if it is assumed that a logic level 1 on the first input of any logic block evaluates to a logic level 0 on the output of the same logic block, then, referring to logic block 210a, it is seen that a rising edge received at input 214aa will propagate through the domino circuit to logic block 236a of stage 206. Therefore, in the ideal situation, the total delay of the domino circuit is equal to the propagation delay time required for a rising edge, or positive going signal, received at the first stage to travel through the cascaded logic blocks to the last stage of the domino circuit.

This ideal situation cannot be achieved by the circuit shown in FIG. 2 because the evaluation transistors provide additional delay. In order to speed up the overall performance of the domino logic circuit, it is desirable to remove the evaluation transistors and couple the logic blocks directly to ground. However, directly coupling the logic blocks to ground results in further problems which must be solved to create an operational circuit. Specifically, if the evaluation device is removed from a particular logic block, then it is important that before the precharge phase of clock 240 is allowed to turn on the precharge transistor, the inputs of the logic block must be pulled low. Otherwise, some of the logic devices in the logic block may be on, and a possible short circuit path from Vdd to ground could result. This could result in surge demands on the power supply, shortened chip life, and possible destruction of the chip.

FIG. 3 shows one attempt to overcome this problem. This circuit is similar to FIG. 2 but has been simplified to show only one logic block per stage for purposes of illustration. In this case, the clock signal is provided to a delay circuit 242 before being provided to the precharge transistor 222 of stage 204, and evaluation transistor 226 has been removed. Delay circuit 242 is designed to cause a delay time which is sufficient to allow the inputs to logic block 224 to be pulled low before delayed clock signal 244 turns on precharge transistor 222.

Although this prevents a possible short circuit condition, the delay circuit also adds additional delay time to the propagation of a positive transition through the circuit. Moreover, an additional clock delay must be provided for each stage in which the evaluation transistor has been removed. Therefore, if additional stages, having no evaluation transistor, are added between stage 204 and stage 206 then an additional clock delay must be provided for each stage. Thus, the delay is cumulative and further reduces the performance of the domino circuit.

Referring now to FIGS. 3 and 3A, there is shown another effort to increase the speed of the domino circuit without risking the possibility of a short circuit path. In this case, the circuit is similar to that shown in FIG. 3, but the delay circuit 242 comprises a series of four inverters 243a–243d, although other commonly used delay circuits could be substituted. The delayed signal 247 is then provided to OR gate 245, along with clock signal 240. The resulting delayed clock signal 244 is then provided to precharge transistor 222. The effect of this technique is described with respect to the timing diagram shown in FIG. 4. As shown, the precharge phase is delayed by time period Tdpc. Tdpc represents the delay due to the delay circuit, in this case, the four inverters plus the delay due to the OR gate 245. However, the evaluation phase is delayed only by time period Tdev, which represents the propagation delay due to the OR gate 245. Thus, the design of OR gate 245 is critical to minimizing delay Tdev.

While this circuit provides improvement over the circuit shown in FIG. 3, it still adds the additional OR gate delay time for each stage and requires additional logic. Additionally, as discussed previously, this delay time is cumulative for each stage without an evaluation transistor. Related efforts to overcome the effect of accumulated delays involve, for example, removing the evaluation transistor only from alternating stages of the domino circuit. However, this still does not eliminate the OR gate delay.

Accordingly, it is an object of the present invention to overcome the above problems and to provide further improvements and advantages which will become apparent in view of the following disclosure.

SUMMARY OF THE INVENTION

One aspect of the present invention relates to a method of precharge and evaluation of a logic block of a dynamic logic circuit. In one embodiment, the method comprises: providing a clock signal to a control terminal of a first transistor coupled to a supply voltage; providing a delayed clock signal to a control terminal of a second transistor connected in series between the first transistor and the logic block; precharging the logic block by setting the clock signal and the delayed clock signal to a first voltage level; and evaluating the logic block by setting the clock signal to a second voltage level.

Another aspect of the invention relates to a circuit for precharging and evaluating a logic block of a dynamic logic circuit, the circuit comprising: series connected first and second transistors disposed between a supply voltage and the logic block, the first transistor having a terminal coupled to the supply voltage and a control terminal responsive to a delayed clock signal, and the second transistor having a terminal connected to the logic block and a control terminal responsive to a clock signal; wherein the logic block is precharged when the clock signal and the delayed clock signal are both at a first voltage level, and the logic block is evaluated when the clock signal is at a second voltage level.

Still a further aspect of the invention relates to a domino CMOS logic circuit having a plurality of stages for evaluating logic signals, the domino CMOS logic circuit including at least one stage which has a logic block and includes a plurality of logic devices, inputs and outputs, and a precharge circuit. In one embodiment, the precharge circuit comprises: a first transistor having a first terminal, a second terminal and a control terminal, the first terminal being coupled to a supply voltage, the control terminal being connected to a delayed clock signal line; a second transistor having a first terminal, a second terminal, and a control terminal, the first terminal of the second transistor being coupled to the second terminal of the first transistor, the control terminal of the second transistor being coupled to a clock signal line, and the second terminal of the second transistor being coupled to an output of the logic block.

DETAILED DESCRIPTION OF EMBODIMENTS OF THE INVENTION

Figure 5:
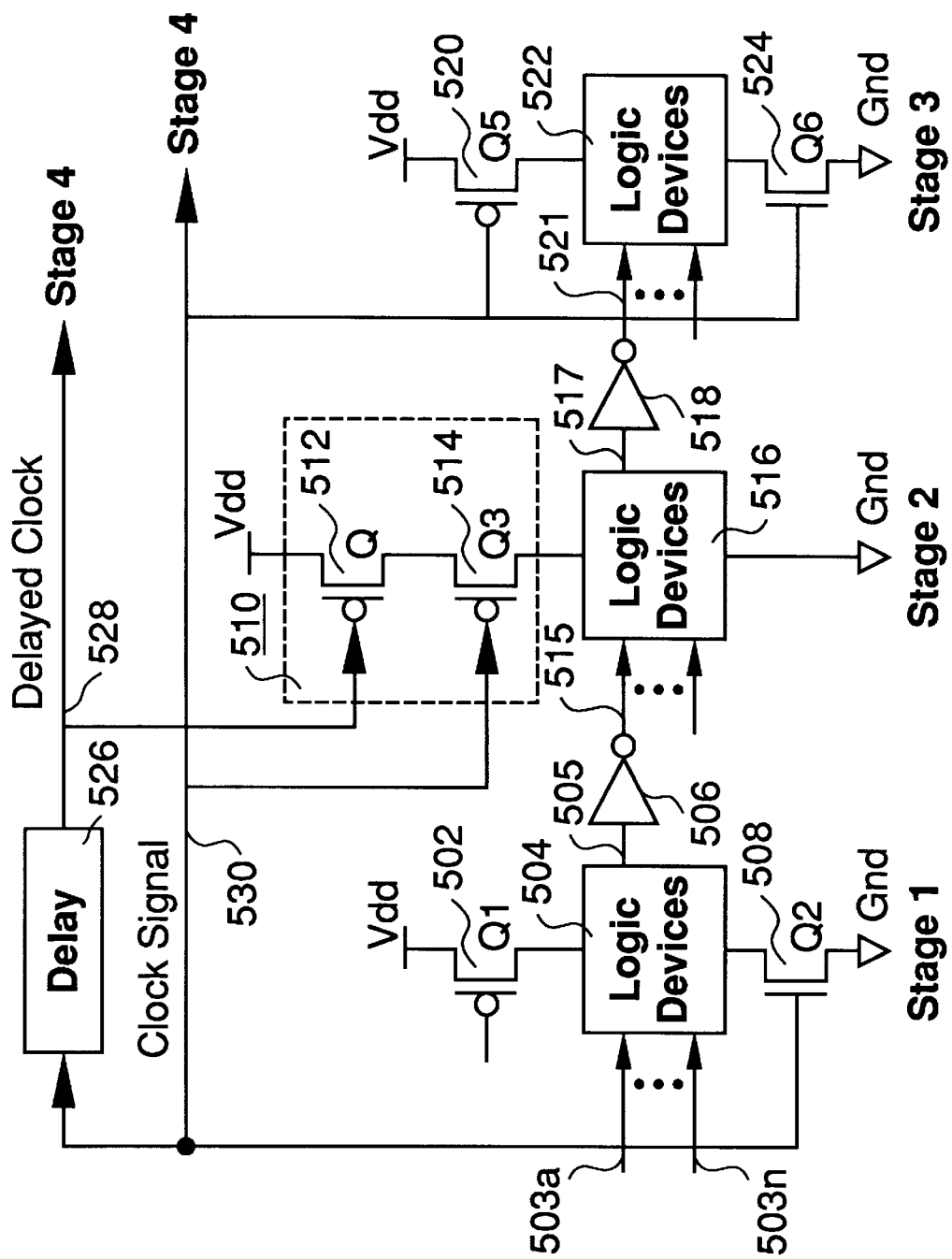
FIG. 5 is a schematic diagram of a domino logic circuit according to one embodiment of the invention.

FIG. 5 is a schematic diagram of a domino logic circuit according to an embodiment of the invention. For purposes of illustration, only one logic block per stage is shown, it being understood that any number of logic blocks can be provided in each stage as a matter of design choice. It will also be understood that although logic blocks 516 and 522 are shown as having only one input, any number of inputs may be provided depending on the internal circuitry of the logic blocks.

In the embodiment shown, the domino logic circuit comprises three stages which are clocked by clock signal 530. Stage 1 comprises logic block 504 having a plurality of inputs 503a–503n and an output 505. In this embodiment, signals provided to inputs 503a–503n are generated by logic external (not shown) to the domino circuit. It should be noted that since the signals provided to inputs 503a–503n, come from external logic, it cannot necessarily be assumed that each will be low when the clock signal on clock signal line 530 is in the precharge phase. Therefore, evaluation transistor 508 has not been removed from the embodiment shown. Of course, it will be appreciated that if a mechanism were provided to ensure the logic level of inputs 503a–503n, or if the design parameters of the domino logic circuit are such that some overlap is permitted between the beginning of the precharge phase and the existence of a high logic level on inputs 503a–503n, then evaluation transistor 508 may be removed in alternate embodiments of the invention.

Output 505 of logic block 504 is precharged high i.e., logic level 1 by precharge transistor 502. Precharge transistor 502 has a first terminal connected a supply voltage (Vdd), a second terminal connected to logic block 504, and a control terminal which controls the flow of current from the first terminal to the second terminal connected to clock signal line 530. In this embodiment, precharge transistor 502 is a PFET device having a source connected to the supply voltage and a drain connected to logic block 504. The gate of precharge transistor 502 is clocked by signals on clock signal line 530.

Evaluation transistor 508 is an NFET device which allows conditional discharge of output 505 to ground. In this embodiment, stage 1 operates as follows. When clock signal line 530 is low, i.e. logic level 0, precharge transistor 502 is turned on while evaluation transistor 508 is turned off, thereby pulling output 505 up to approximately the voltage level on the source of precharge transistor 502. When clock signal line 530 goes high, precharge transistor 502 is turned off, and evaluation transistor 508 is turned on, thereby allowing the voltage stored on output 505 to conditionally discharge, depending on how the logic devices within logic block 504 evaluate with respect to inputs 503a–503n.

Stage 3 comprises precharge transistor 520, logic block 522, input 521 and evaluation transistor 524. Although not specifically illustrated, it is understood that the output from logic block 522 is provided to other logic circuits external to the domino circuit, or, in the alternate embodiments, the logic devices comprise registers which are accessible by other circuits on the chip. Otherwise, the operation of stage 3 is substantially similar to that of stage 1 and will not be further described.

Stage 2 comprises precharge/evaluation circuit 510 coupled to logic block 516. It will be apparent to those skilled in the art that no evaluation transistor is provided for stage 2, and, therefore, output 517 may discharge to ground at any time, depending on the logic levels of input 515 to logic block 516.

Precharge/evaluation circuit 510 comprises a pair of series connected transistors, each having a control terminal which controls the flow of current from a first terminal to a second terminal. In the embodiment shown, transistors 512 and 514 are PFET devices. Transistor 512 includes a source which is connected to a supply voltage, Vdd in this illustration, a gate coupled to delayed clock line 528 and a drain coupled to the source of transistor 514. The gate of transistor 514 is coupled to clock signal line 530 and its drain is connected to logic block 516. Transistor 512 is clocked by signals on the delayed clock signal line 528 while transistor 514 is clocked by signals on clock signal line 530.

When delayed clock signal line 528 and clock signal line 530 are both low, transistors 512 and 514 are both on and output 517 is are pulled high. Conversely, when either delayed clock signal line 528 or clock signal line 530 is high, then the path from the supply voltage to output 517 is interrupted, allowing conditional discharge to ground. It will be understood by those skilled in the art that the supply from Vdd to logic block 516 must be interrupted for suitable conditional discharge to occur. Otherwise, as output 517 attempts to discharge, it will be simultaneously be recharged by the flow of current from Vdd, thus causing "fighting" between precharge circuit 510 and logic block 516.

Figure 6:
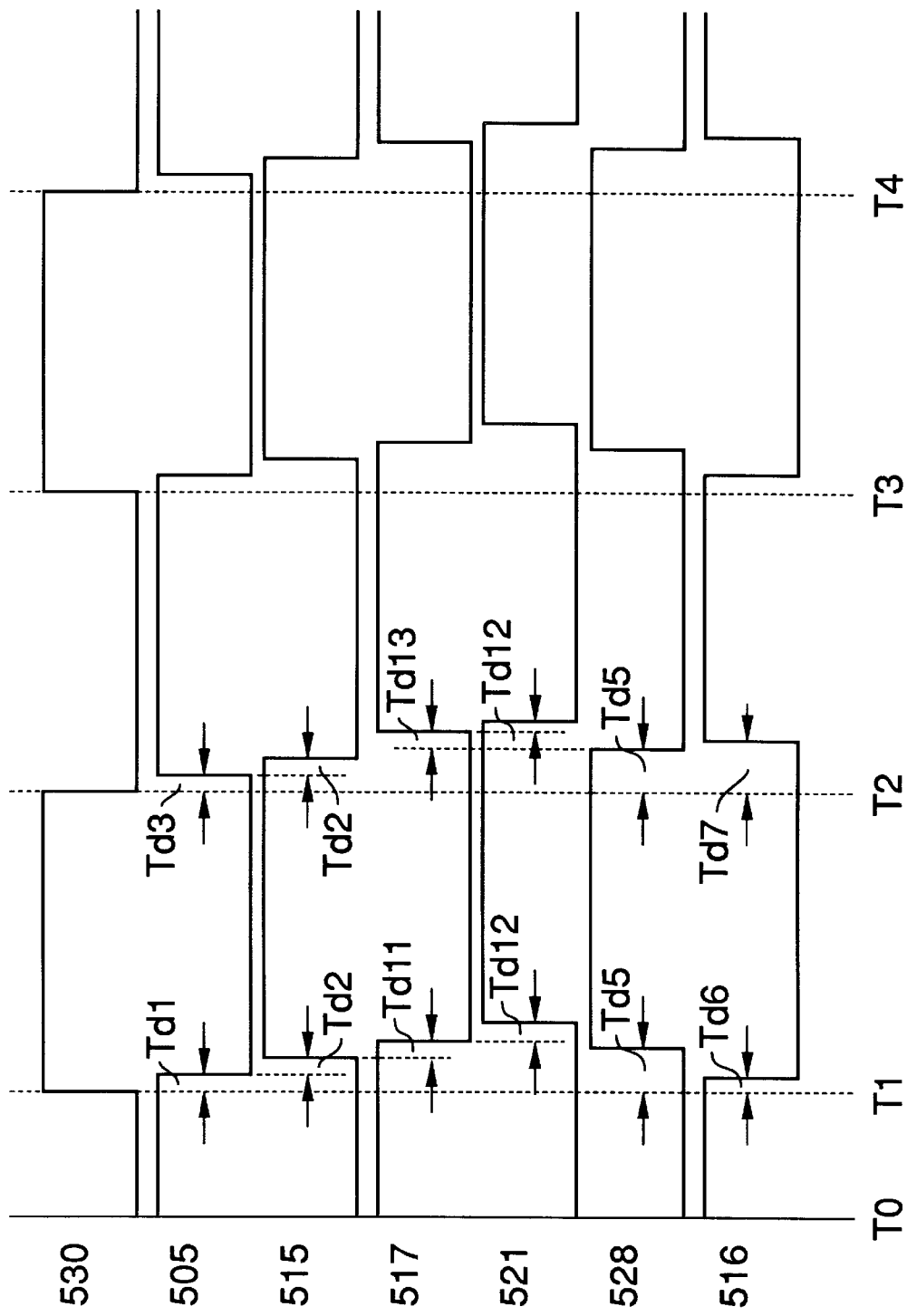
FIG. 6 is a timing diagram illustrating the operation of the circuit shown in FIG. 5.

The operation of stage 2 in the embodiment shown in FIG. 5 is further described with respect to the timing diagram shown in FIG. 6. For purposes of illustration, it is assumed that the circuitry in logic block 504 and the input signals received at inputs 503a–503n are such that during the evaluation phase output 505 will be pulled low.

Initially, at time TO clock signal line 530 and delayed clock signal line 528 are both in the precharge phase, i.e. low. Accordingly, output 505 is high and input 515 to logic block 516 is low. At time T1, clock signal line 530 goes high, thus starting the evaluation phase. Of course, it will be appreciated that output 505 will discharge only after a certain delay time Td1 which is related to the devices comprising its discharge path in logic block 504, plus the time delay required for evaluation transistor 508 to turn on. Output 505 is connected to input 515 through inverter 506. Therefore, when output 505 discharges low, input 515 rises high after time delay Td2 due to inverter 506.

The effect of the positive going transition on input 515 is then evaluated by logic block 516. Depending on the logic function implemented by logic block 516, output 517 may discharge with delay of Td11 and the negative going transition is passed to logic block 522 through inverter 518 as signal 521 with a delay of Td12 where it is again evaluated according to the logic function of logic block 522.

Figure 1:
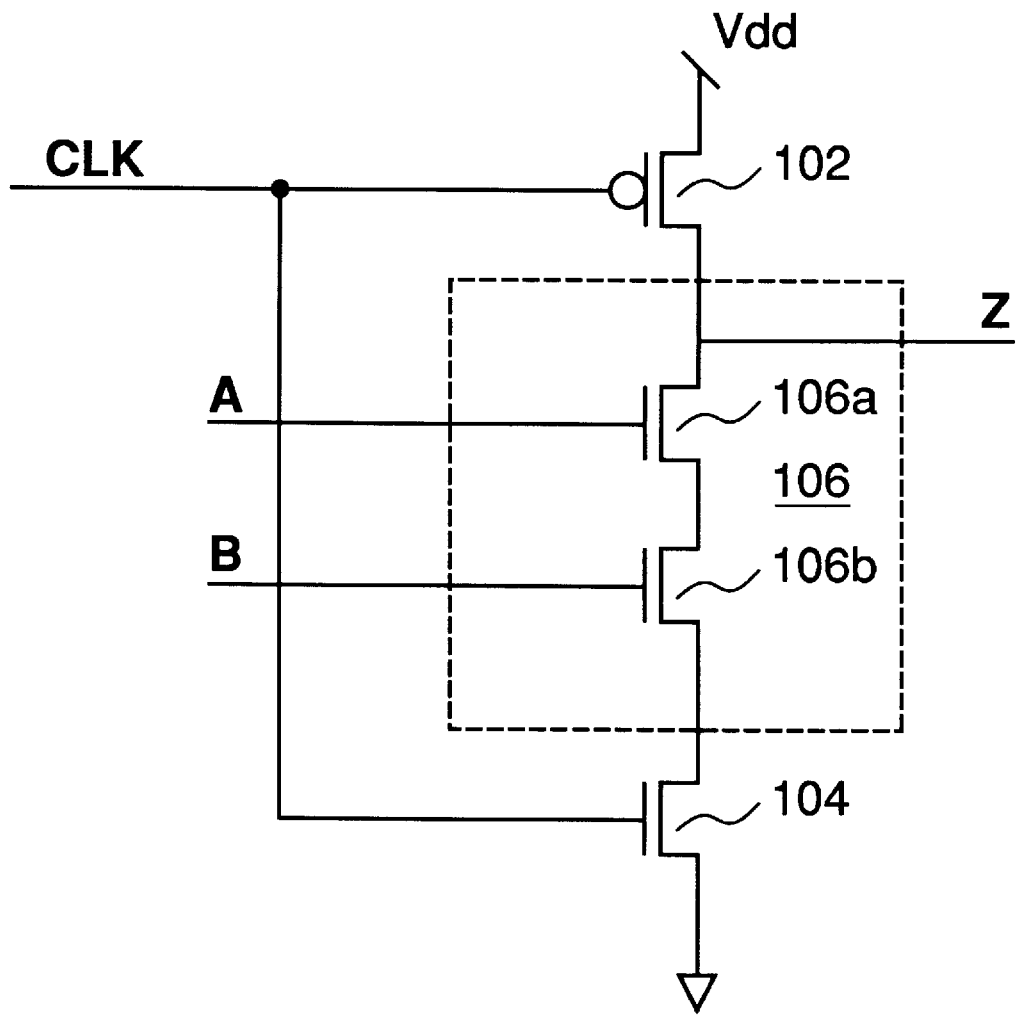
FIG. 1 is a schematic diagram of a conventional dynamic logic circuit.
Figure 2:
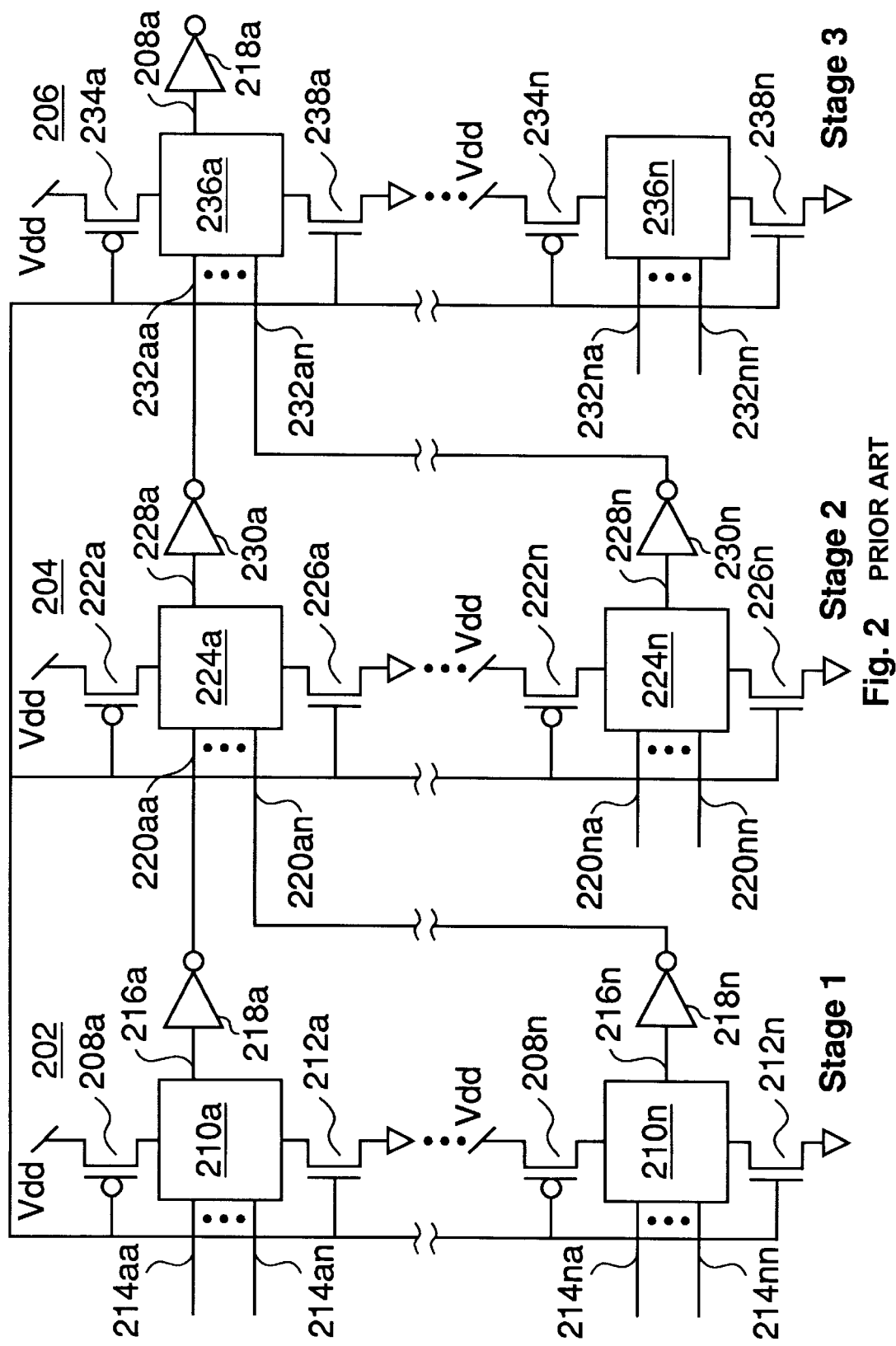
FIG. 2 is a schematic diagram of a conventional domino logic circuit.
Figure 3:
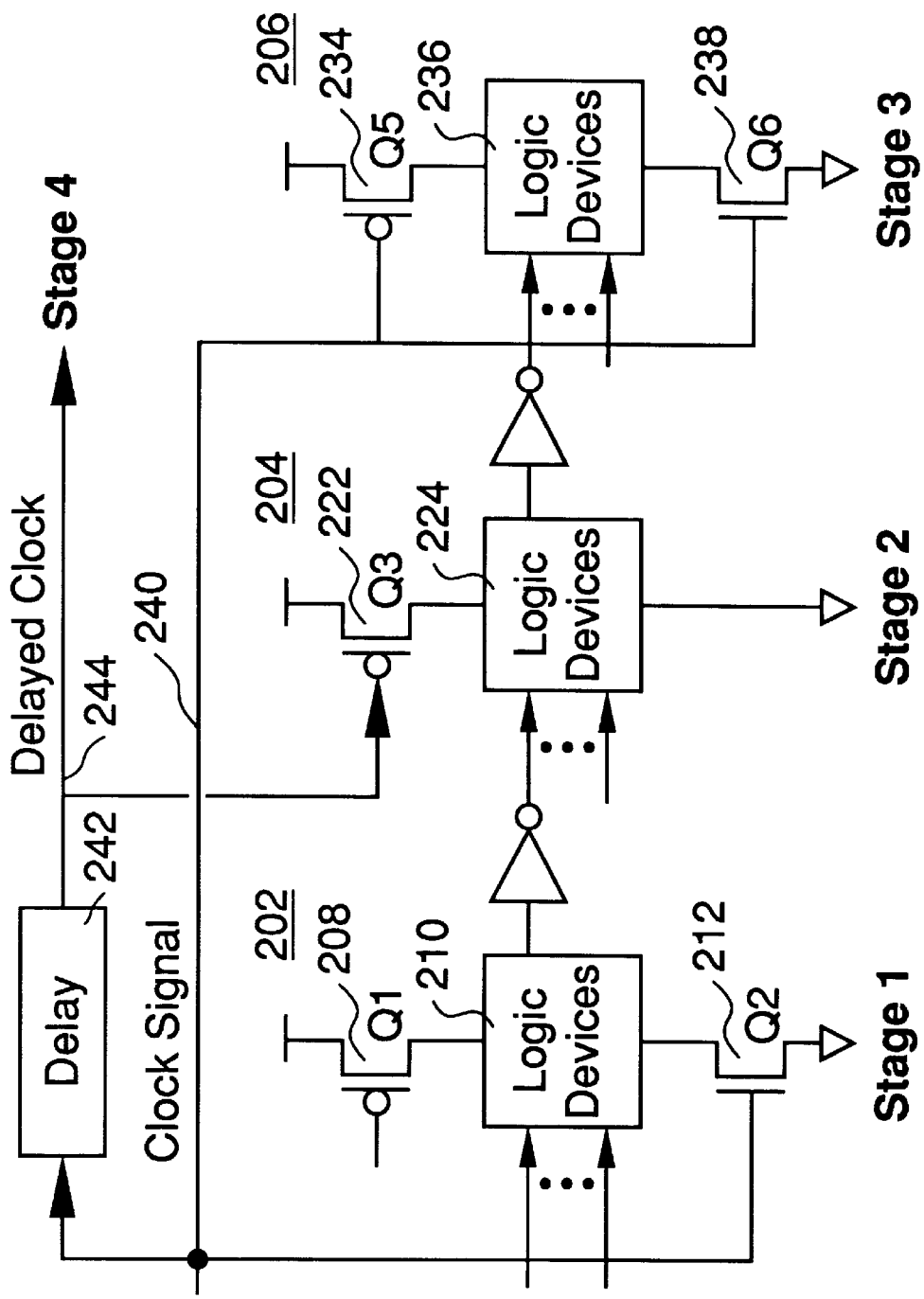
FIG. 3 is a schematic diagram of a conventional domino logic circuit with one evaluation transistor removed.
Figure 3A:
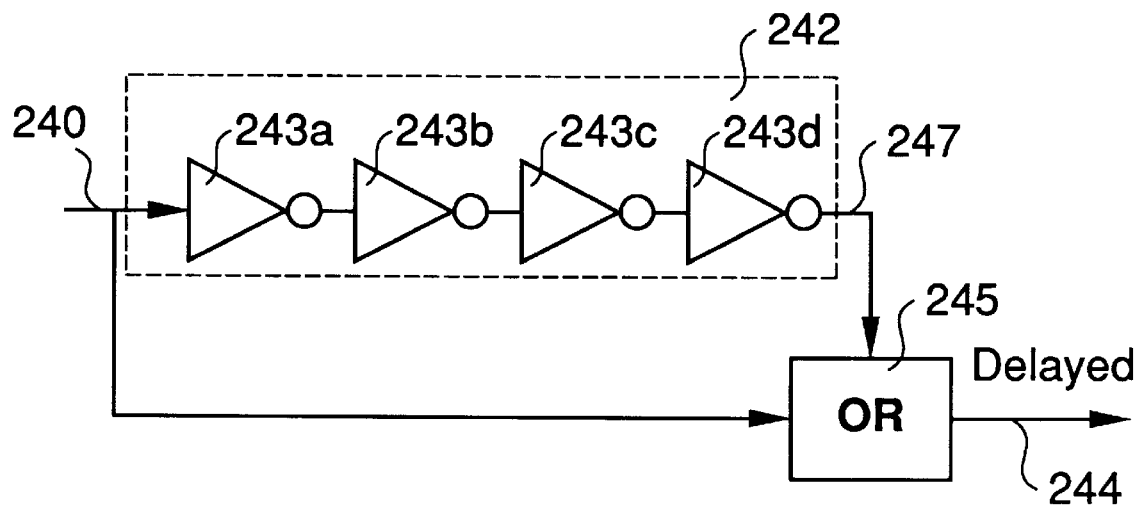
FIG. 3A is a schematic diagram of a delay circuit useful in the domino logic circuit of FIG. 3.
Figure 4:
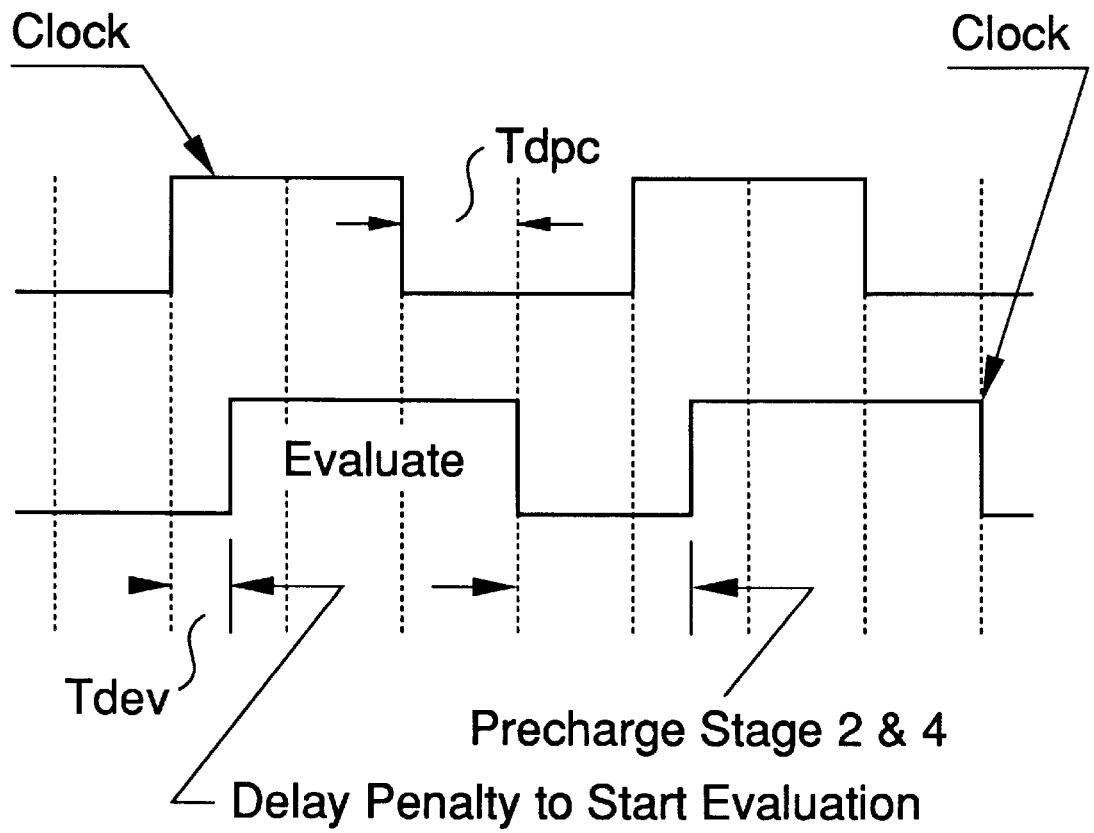
FIG. 4 is a timing diagram illustrating the operation of the circuit shown in FIG. 3A.

In order for the domino circuit to achieve the highest possible performance, it is desirable that precharge/evaluate circuit 510 allow logic block 516 to evaluate as quickly as possible when clock signal line 530 goes high. This rapid evaluation is provided by transistor 514. Specifically, it is seen that clock signal line 530 is provided directly to the gate of transistor 514, and therefore, there is no additional circuitry interposed which would delay the evaluation of logic block 516. Thus, even though transistor 512 is still on at time T1 due to delay 526, logic block 516 is nevertheless isolated from the supply voltage by transistor 514 which is turned off by the rising edge of clock signal 530. This allows logic block 516 to begin evaluation of input 515 after time delay Td6 which is equal to the time required to turn off transistor 514. This may be contrasted with time Tdev shown in FIG. 3A which is equal to the sum of the turn off time of the precharge transistor 222 plus the additional delay caused by OR gate 245. Therefore, it will be appreciated that the delay caused by ORing the clock signal and the delayed clock signal is eliminated. Moreover, the additional circuitry and chip area required to implement the OR gate is also eliminated. Output 517 may now conditionally discharge as soon as input 515 goes high.

At time T2, clock signal line 530 goes low, thus beginning another precharge phase. This causes transistor 502 to turn on pulling output 505 high after a time delay Td3 related to the switching speed of transistor 502. Pulling output 505 high causes input 515 to go low after a time delay Td2 due to inverter 506.

It will be appreciated that, due to the possibility of a discharge condition existing for output 515, the precharge/ evaluation circuit 510 must delay precharge of logic block 516 for a time period Td5, which is equal to the sum of time period Td3 plus Td2 plus any desired guardband, to ensure that no short circuit occurs. In alternate embodiments of the invention, some overlap between the precharge phase and the discharge of input 515 is permitted. However, the greater the overlap, the more likely it is that problems occur in the domino circuit, such as increased power consumption, surge demands on the power supply, and even damage or destruction of the chip. Therefore, the amount of any permitted overlap, or required guardband, will depend on timing and process parameters unique to specific integrated circuit designs.

In the embodiment shown in FIG. 5, transistor 514 is clocked by clock signal line 530 and turns on at time T2. Therefore, time delay Td5 is provided by transistor 512 which is clocked by delayed clock signal line 528. The length of delay time Td5 set by delay circuit 526. As discussed previously, one suitable delay circuit comprises a number of serially connected inverters. The number of inverters being dependent on the amount of delay required. Other suitable delay circuits are well known in the art and are employed in other embodiments of the invention.

Figure 7:
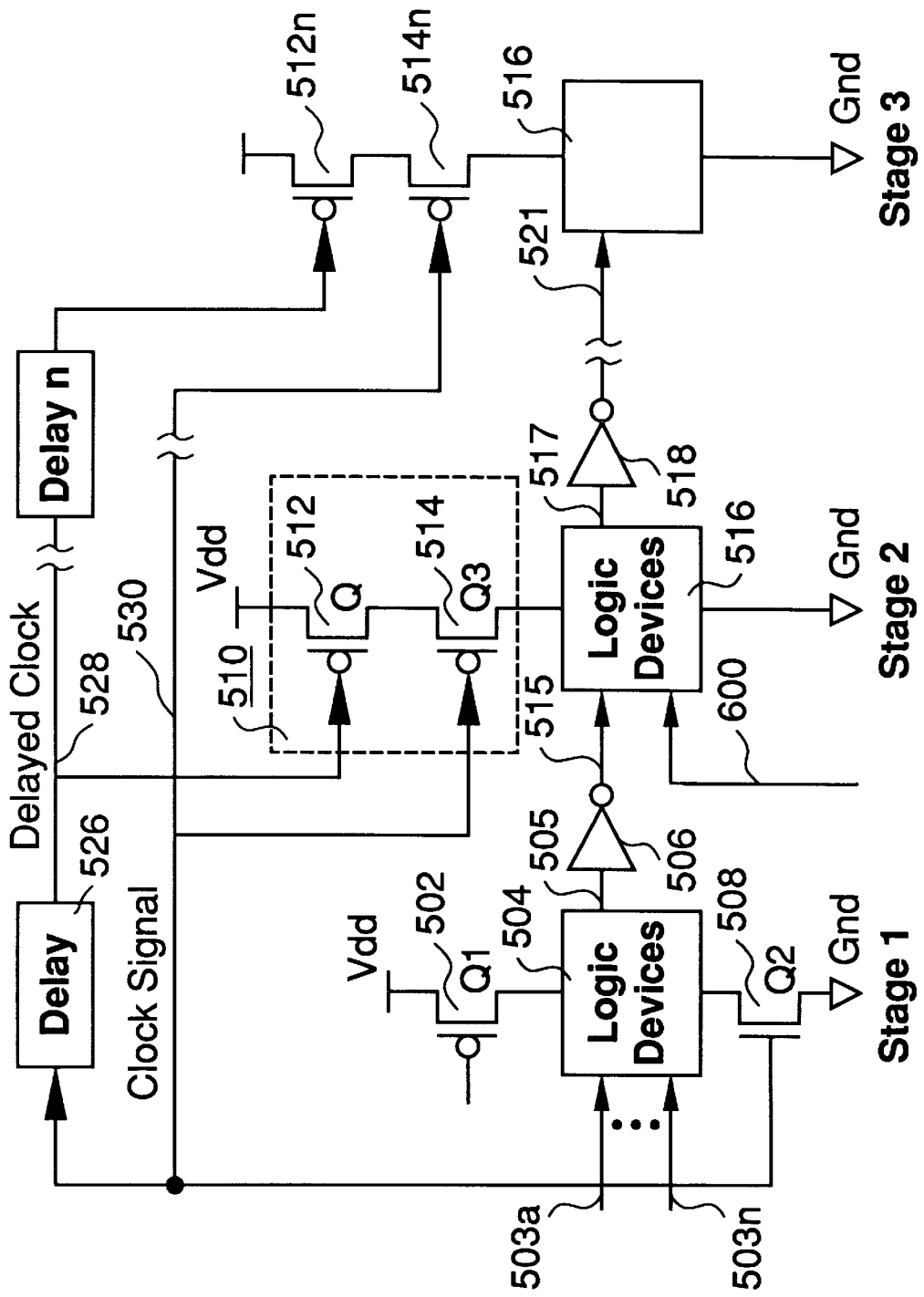
FIG. 7 is a schematic diagram of a domino logic circuit according to a further embodiment of the invention.

From the foregoing discussion, it will be clear to those skilled in the art that the present invention, as illustrated in the embodiment shown in FIG. 5, allows evaluation to occur upon the rising edge of the clock signal while delaying precharge until the inputs to a particular logic block have been properly set to a low logic level. It will also be apparent to those skilled in the art that the 3 stage domino circuit shown in FIG. 5 is for purposes of illustration only, and that any number of stages can be provided. For example, FIG. 7 is a schematic diagram of an embodiment of the invention in which n stages have been provided by cascading stages similar to stage 2. In still further embodiments of the invention, additional inputs from circuits external to the domino circuit are provided to individual logic blocks within the domino circuit. This is shown in FIG. 7 in which input 600 is provided to stage 2. Care must be taken in this embodiment to avoid damaging short circuit conditions during the precharge phase. In still further embodiments, the evaluation transistor need not be removed from each stage of the domino circuit. Depending on timing, and other considerations, it is useful to remove the evaluation transistor only from every other stage, or from particularly selected stages in the domino circuit.

In still further embodiments, precharge/evaluation circuit 510 comprises a pair of stacked transistors. This allows the circuit to be fabricated using even a smaller amount of silicon area. In yet further embodiments, the transistors are not limited to field effect devices, but, for example, in a BiCMOS process, the transistors used in circuit 510 comprises bipolar transistors, wherein the delayed clock line is provided to the base of the upper transistor, i.e. the equivalent of transistor 512, while the collector is coupled to Vdd and the emitter is coupled to the collector of the lower transistor. The lower transistor in this embodiment has a base coupled to the clock signal line and an emitter coupled to logic block 516.

While the invention has been particularly shown and described with reference to the above embodiments, it will be understood by those skilled in the art that various changes in form and detail may be made therein without departing from the scope and the spirit of the invention. For example, aspects of the invention are also useful in other dynamic logic circuits which are not cascaded together in domino fashion or are fabricated in non-CMOS technologies such as TTL logic.

What is claimed is:

1. A method for controlling precharge and evaluation of a logic block of a dynamic logic circuit, the method comprising:

providing a delayed clock signal to a control terminal of a first transistor coupled to a supply voltage;

providing a clock signal to a control terminal of a second transistor connected in series between the first transistor and the logic block, such that on a voltage level transition of the clock signal, the delayed clock signal transitions to the same voltage level as the clock signal after a time delay but before a subsequent transition of the clock signal;

precharging the voltage block by setting the clock signal and the delayed clock signal to a first voltage level; and evaluating the logic block by setting the clock signal to a second voltage level.

2. A method as in claim 1 wherein precharging the logic block comprises pulling the clock signal and the delayed clock signal low.

3. A method as in claim 1 wherein evaluating the logic block comprises pulling the clock signal high.

4. A method as in claim 1 wherein precharging the logic block comprises pulling an output of the logic block high.

5. A circuit for precharging and evaluating a logic block of a dynamic logic circuit, the circuit comprising:

series connected first and second transistors disposed between a supply voltage and the logic block, the first transistor having a terminal coupled to the supply voltage and a control terminal responsive to a delayed clock signal, and the second transistor having a terminal connected to the logic block and a control terminal responsive to a clock signal;

wherein upon a voltage level transition of the clock signal, the delayed clock signal transitions to the same voltage level as the clock signal after a time delay but before a subsequent transition of the clock signal, the logic block being precharged when the clock signal and the delayed clock signal are both at a first voltage level, and evaluated when the clock signal is at a second voltage level.

6. A circuit as in claim 5 wherein the first transistor is a PFET device having a source connected to the supply voltage, a gate connected to a delayed clock signal line, and a drain connected to a source of the second transistor.

7. A circuit as is claim 6 wherein the second transistor is a PFET device having a gate connected to a clock signal line and a drain connected to the logic block.

8. A circuit as in claim 5 wherein the first and second transistors are stacked.

9. A circuit as in claim 5 wherein the first transistor is a bipolar device having a collector connected to the supply voltage, a base connected to a delayed clock signal line, and an emitter connected to a collector of the second transistor.

10. A circuit as in claim 9 wherein the second transistor is a bipolar device having a base connected to a clock signal line and an emitter connected to the logic block.

11. A domino CMOS logic circuit having a plurality of stages for evaluating logic signals, the domino CMOS logic circuit including at least one stage which has a logic block that includes a plurality of logic devices responsive to at least one input, an output and a precharge circuit for precharging the output, the precharge circuit comprising:

a first transistor having a first terminal, a second terminal and a control terminal, the first terminal being coupled to a supply voltage, the control terminal being connected to a delayed clock signal line;

a second transistor having a first terminal, a second terminal and a control terminal, the first terminal of the second transistor being coupled to the second terminal of the first transistor, the control terminal of the second transistor being coupled to a clock signal line, and the second terminal of the second transistor being coupled to the output of the logic block; wherein upon a voltage level transition of the clock signal, the delayed clock signal transitions to the same voltage level as the clock signal after a time delay but before a subsequent transition of the clock signal.

12. A domino CMOS logic circuit as in claim 11 wherein the first transistor is a field effect device which comprises a source coupled to the supply voltage, a drain, and a gate coupled to the delayed clock signal line.

13. A domino CMOS logic circuit as in claim 12 wherein the second transistor is a field effect device which comprises a source coupled to the drain of the first transistor, a gate coupled to the clock signal line, and a drain coupled to the outputs of the logic block.

14. A domino CMOS logic circuit as in claim 11 wherein the first transistor comprises a bipolar device having a collector coupled to the supply voltage, a base coupled to the delayed clock signal line, and an emitter.

15. A domino CMOS logic circuit as in claim 14 wherein the second transistor comprises a bipolar device having a collector coupled to the emitter of the first transistor, a base coupled to the clock signal line, and a collector coupled to the outputs of the logic block.

16. A circuit useful in precharging and evaluating a logic block, the circuit comprising:

a pair of series connected transistors coupling a supply voltage to a prechargeable output of a logic block, one transistor of the pair having a clock signal coupled to its gate, and the other transistor of the pair having a delayed clock signal coupled to its gate, such that the delayed clock signal transitions to the same voltage level as the clock signal after a time delay but before a subsequent transition of the clock signal;

wherein an electrical connection is established between the supply voltage and the prechargeable output when the clock signal and the delayed clock signal are both at a low voltage level, and the electrical connection is broken when the clock signal is at a high voltage level.

17. A circuit as in claim 16 wherein the output conditionally discharges to ground through a conductive path in the logic block when the clock signal is at a high voltage level, the conductive path being free of any clocked footer devices.

* * * * *